(12) United States Patent
Saito

(10) Patent No.: US 9,423,775 B2
(45) Date of Patent: Aug. 23, 2016

(54) SOLAR PANEL AND TIMEPIECE INCLUDING SOLAR PANEL

(71) Applicant: CASIO COMPUTER CO., LTD., Shibuya-ku, Tokyo (JP)

(72) Inventor: Yuta Saito, Kokubunji (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 14/823,445

(22) Filed: Aug. 11, 2015

(65) Prior Publication Data

US 2015/0346695 A1    Dec. 3, 2015

Related U.S. Application Data

(62) Division of application No. 14/195,552, filed on Mar. 3, 2014, now Pat. No. 9,134,706.

(30) Foreign Application Priority Data

Mar. 4, 2013    (JP) .................................. 2013-041639

(51) Int. Cl.
*G04C 10/00*    (2006.01)
*G04G 19/00*    (2006.01)
(Continued)

(52) U.S. Cl.
CPC ............... *G04G 19/00* (2013.01); *G04C 10/02* (2013.01); *H01L 31/02* (2013.01); *H01L 31/042* (2013.01); *H01L 31/046* (2014.12); *G04C 10/00* (2013.01); *H01L 31/0463* (2014.12); *Y02E 10/50* (2013.01)

(58) Field of Classification Search
CPC .... G04C 10/02; G04C 10/00; H01L 31/0463; H01L 31/0465; H01L 31/02; G04G 19/00

USPC ......................................................... 368/205
See application file for complete search history.

(56) References Cited

U.S. PATENT DOCUMENTS 4,194,496 A    3/1980    Carlson
6,225,552 B1    5/2001    Nishi et al.
(Continued)

FOREIGN PATENT DOCUMENTS

EP    1126337 A1    8/2001
EP    2447791 A1    5/2012
(Continued)

OTHER PUBLICATIONS

International Search Report including Written Opinion dated Sep. 17, 2014 issued in parent International Application No. PCT/JP2014/056382.

(Continued)

*Primary Examiner* — Sean Kayes
(74) *Attorney, Agent, or Firm* — Holtz, Holtz & Volek PC

(57) ABSTRACT

A solar panel, above which a pointer mounted on a pointer shaft inserted in a through hole in a center portion of the solar panel moves, includes a plurality of solar cells arranged in a substantially circular shape, and these solar cells have been divisionally formed into a substantially spiral shape so that the pointer is positioned over two of the plurality of solar cells. Accordingly, the pointer can always be positioned over two of the plurality of solar cells, and therefore a decrease of light-receiving area due to the pointer can be distributed between the two solar cells. As a result, a decrease in the output current of the plurality of solar cells over which the pointer is positioned can be suppressed, and the output current of the entire plurality of solar cells can be improved.

6 Claims, 10 Drawing Sheets

(51) Int. Cl.
*G04C 10/02* (2006.01)
*H01L 31/042* (2014.01)
*H01L 31/02* (2006.01)
*H01L 31/046* (2014.01)
*H01L 31/0463* (2014.01)

(56) References Cited

U.S. PATENT DOCUMENTS

| | | | |
|---|---|---|---|
| 6,372,977 | B1 | 4/2002 | Miyoshi |
| 6,791,905 | B1 | 9/2004 | Sekiguchi |
| 7,014,329 | B2 | 3/2006 | Claypool |
| 2002/0029798 | A1 | 3/2002 | Miyoshi |
| 2004/0079358 | A1 | 4/2004 | Arkas et al. |
| 2012/0057439 | A1 | 3/2012 | Shimizu et al. |
| 2012/0105288 | A1 | 5/2012 | Abe |
| 2012/0222717 | A1 | 9/2012 | Chandrasekaran et al. |
| 2013/0298959 | A1* | 11/2013 | Alam .............. H01L 31/035281 136/244 |
| 2014/0060614 | A1* | 3/2014 | Saito ................... H01L 31/0465 136/244 |

FOREIGN PATENT DOCUMENTS

| | | |
|---|---|---|
| JP | 51006761 A | 1/1976 |
| JP | 10039057 A | 2/1998 |
| JP | 2006275525 A | 10/2006 |
| WO | 9804005 A1 | 1/1998 |
| WO | 0031596 A1 | 6/2000 |

OTHER PUBLICATIONS

Korean Office Action (and English translation thereof) dated Mar. 18, 2016, issued in counterpart Korean Application No. 10-2015-7021738.

Japanese Office Action (and English translation thereof) dated Feb. 5, 2016, issued in counterpart Japanese Application No. 2013-041639.

* cited by examiner

SOLAR PANEL AND TIMEPIECE INCLUDING SOLAR PANEL

CROSS-REFERENCE TO RELATED APPLICATION

This application is a Divisional of U.S. Ser. No. 14/195,552, filed Mar. 3, 2014, which is based upon and claims the benefit of priority from the prior Japanese Patent Application No. 2013-041639, filed Mar. 4, 2013, the entire contents of both of which are incorporated herein by reference.

BACKGROUND OF THE INVENTION

1. Field of the Invention

The present invention relates to a solar panel that is used in a pointer-type timepiece such as a wristwatch or a pointer-type measuring instrument such as a meter, and a timepiece including the solar panel.

2. Description of the Related Art

For example, a solar panel for use in a wristwatch is known in which a plurality of solar cells each formed into a fan shape so as to have an equal area are circularly arranged and connected in series, as described in Japanese Patent Application Laid-Open (Kokai) Publication No. 10-039057.

This type of solar panel is structured to have a through hole provided in its center and a pointer shaft inserted in the through hole to protrude upward. On the upper end of the pointer shaft, a pointer is mounted, and moves above the plurality of solar cells.

In this type of solar panel, the value of output current obtained by the plurality of solar cells as a whole becomes equal to the value of the smallest output current obtained by one of the plurality of solar cells due to electrical characteristics of a diode or the like.

Accordingly, when the pointer is positioned over one of the plurality of solar cells, the light-receiving area of the solar cell over which the pointer has been positioned becomes smaller than the light-receiving areas of the other solar cells.

As a result, the output current of the solar cell over which the pointer has been positioned becomes smaller than the output currents of the other solar cells, and the value of the output current obtained by the plurality of solar cells as a whole becomes equal to this smallest output current of the solar cell. Thus, there is a problem in this solar panel in that a loss of the output current of the plurality of solar cells as a whole is disadvantageously large.

SUMMARY OF THE INVENTION

The present invention is to provide a solar panel capable of improving output current by dispersing a decrease of a light-receiving area due to a pointer by a plurality of solar cells, and a timepiece including the solar panel.

In order to achieve the above-described object, in accordance with one aspect of the present invention, there is provided a solar panel formed into a substantially circular shape and having a through hole which is provided in a center portion and into which a pointer shaft is inserted, and a pointer which is mounted on the pointer shaft and moves above the solar panel, comprising: a plurality of solar cells arranged in a substantially circular shape, wherein the plurality of solar cells are divisionally formed into a substantially spiral shape such that the pointer moving above the plurality of solar cells is always positioned over at least two of the plurality of solar cells.

In accordance with another aspect of the present invention, there is provided a timepiece comprising: a timepiece module having a timepiece movement, a solar panel, a dial plate, and a housing; and a timepiece case where the timepiece module is placed, wherein the solar panel is formed into a substantially circular shape, and has a through hole which is provided in a center portion and into which a pointer shaft is inserted, and a pointer which is mounted on the pointer shaft and moves above the solar panel, and wherein the solar panel includes a plurality of solar cells arranged in a substantially circular shape, and the plurality of solar cells are divisionally formed into a substantially spiral shape such that the pointer moving above the solar cells is always positioned over at least two of the plurality of solar cells.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 2A, FIG. 2B and FIG. 2C depict pointers of the timepiece module depicted in FIG. 1, of which FIG. 2A is an enlarged front view of a second hand, FIG. 2B is an enlarged front view of a minute hand, and FIG. 2C is an enlarged front view of an hour hand;

DETAILED DESCRIPTION OF THE PREFERRED EMBODIMENTS

First Embodiment

A first embodiment in which the present invention has been applied to a pointer-type wristwatch will hereinafter be described with reference to FIG. 1 to FIG. 4.

Figure 1:
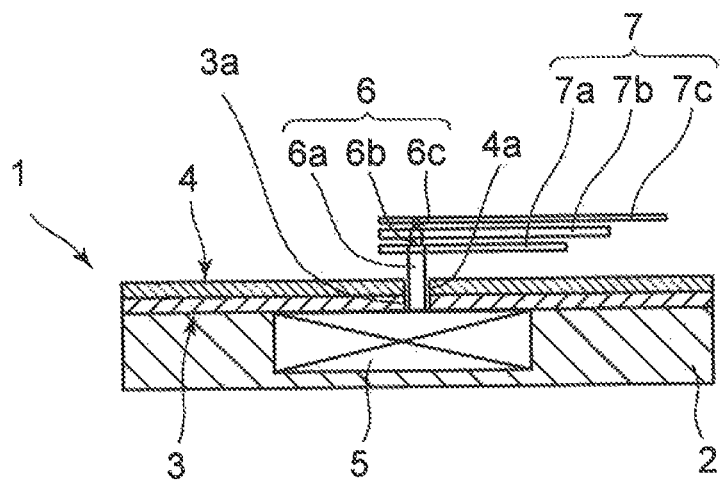
FIG. 1 is an enlarged sectional view of a timepiece module in a first embodiment in which the present invention has been applied to a pointer-type wristwatch.

This pointer-type wristwatch includes a timepiece module 1 as depicted in FIG. 1.

The timepiece module 1, which is arranged in a wristwatch case (not depicted in the drawing), has a housing 2.

On the upper surface of the housing 2, a solar panel 3 is arranged, and a dial plate 4 is arranged on the upper surface of this solar panel 3, as depicted in FIG. 1.

Inside the housing 2, a timepiece movement 5 is provided.

The timepiece movement 5 is structured to move pointers 7 such as an hour hand 7a, a minute hand 7b, and a second hand 7c by rotating a pointer shaft 6.

In this case, the dial plate 4 is constituted by a transparent or translucent film, and formed into a substantially circular shape.

On peripheral portions on the upper surface of the dial plate 4, time characters (not depicted in the drawing) are provided at predetermined spacing.

The pointer shaft 6 has a cylindrical hour-hand shaft 6a, a cylindrical minute-hand shaft 6b rotatably arranged in the hour-hand shaft 6a, and a second-hand shaft 6c rotatably arranged in the minute-hand shaft 6b, and is structured to protrude above the dial plate 4 via a through hole 3a provided in the center of the solar panel 3 and a through hole 4a provided in the center of the dial plate 4.

The pointers 7 are respectively mounted on an upper end portion of the pointer shaft 6 as depicted in FIG. 1 and FIG. 2A to FIG. 2C.

That is, the hour hand 7a is mounted on the upper end of the hour-hand shaft 6a, the minute hand 7b is mounted on the upper end of the minute-hand shaft 6b, and the second hand 7c is mounted on the upper end of the second-hand shaft 6c.

As a result, the timepiece movement 5 is structured to move the pointers 7 including the hour hand 7a, the minute hand 7b, and the second hand 7c above the dial plate 4 by rotating the pointer shaft 6 including the hour-hand shaft 6a, the minute-hand shaft 6b, and the second-hand shaft 6c.

Figure 2A:
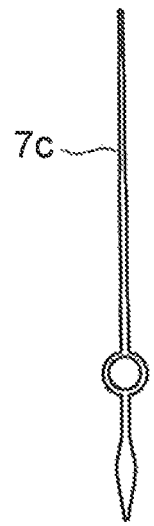
Figure 2B:
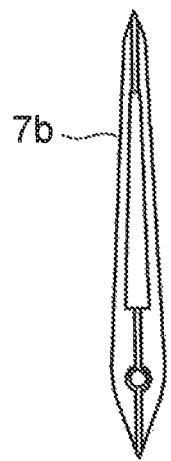
Figure 2C:
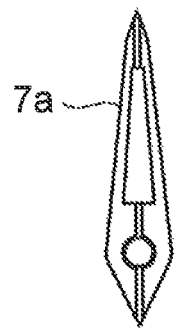

In this case, among the hour hand 7a, the minute hand 7b, and the second hand 7c, the minute hand 7b is formed to have the largest surface area as compared with the hour hand 7a and the second hand 7c, as depicted in FIG. 2A to FIG. 2C.

As a result, the area of the minute hand 7b, which blocks external light applied to the solar panel 3, is larger than those of the hour hand 7a and the second hand 7c, and therefore the minute hand 7b has the largest influences on the light-receiving area of the solar panel 3.

Thus, in the following descriptions, the minute hand 7b is mainly explained.

Figure 3:
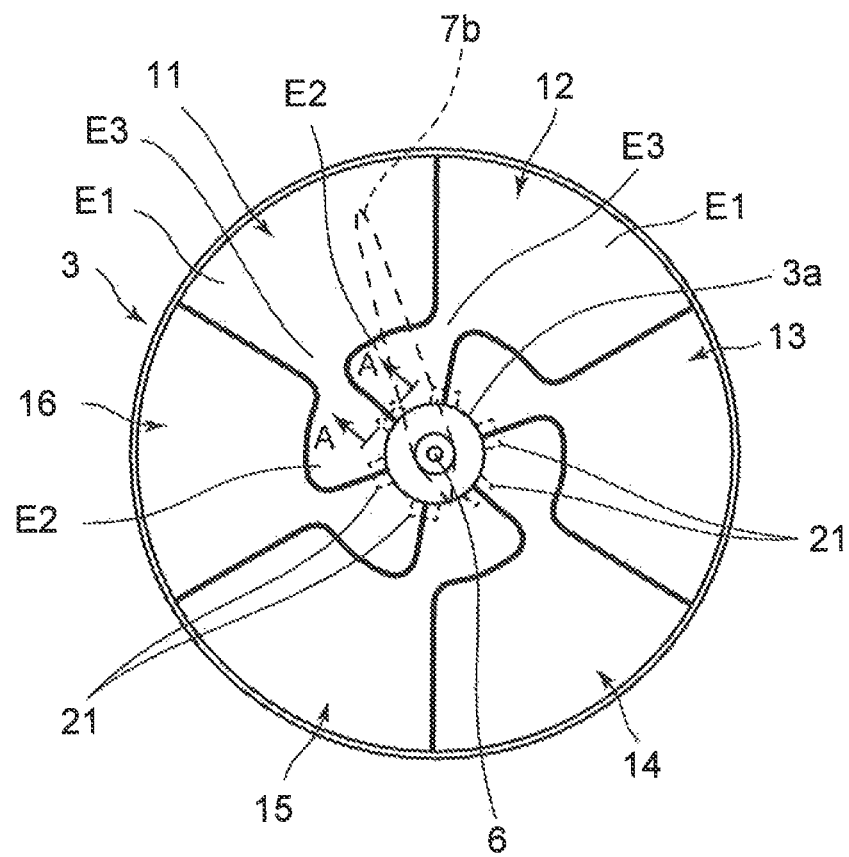
FIG. 3 is an enlarged front view of a solar panel of the timepiece module depicted in FIG. 1.

The solar panel 3 is formed into a circular shape, which is substantially equal in size to the dial plate 4, as depicted in FIG. 1 and FIG. 3.

This solar panel 3 includes a plurality of solar cells 11 to 16.

Figure 4:
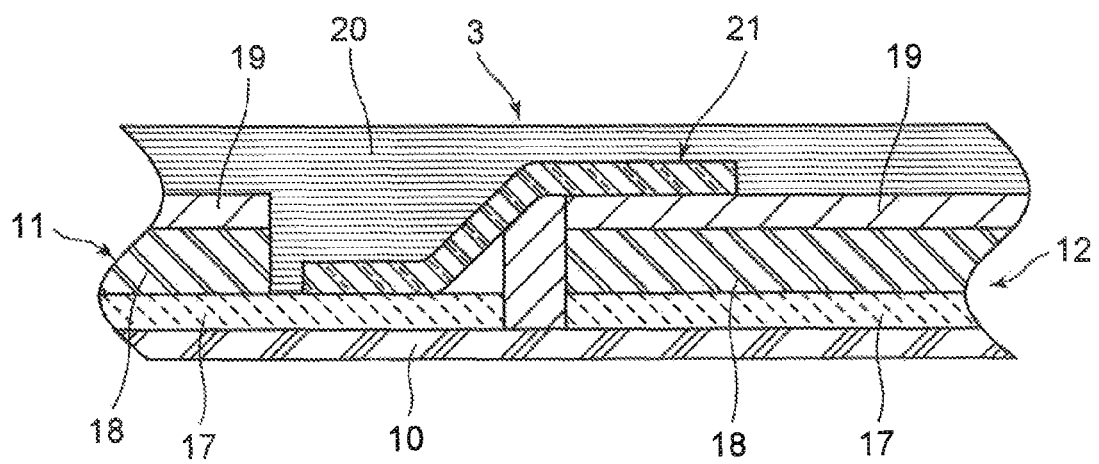
FIG. 4 is an enlarged sectional view of a connecting section of the solar panel taken along line A-A in FIG. 3.

The plurality of solar cells 11 to 16 are arranged in a circular shape centering on the through hole 3a on the upper surface of a film substrate 10, as depicted in FIG. 3 and FIG. 4.

In this case, each of the plurality of solar cells 11 to 16 is structured such that a lower electrode 17 made of metal such as aluminum is formed by patterning on the film substrate 10, a power generation layer 18 constituted by a semiconductor layer made of amorphous silicon (a-Si) or the like is formed by patterning on the lower electrode 17, a transparent upper electrode 19 made of ITO (Indium Tin Oxide) or the like is formed by patterning on the power generation layer 18, and a protective film 20 made of transparent insulating synthetic resin covers the upper electrode 19, as depicted in FIG. 4.

As a result, each of the plurality of solar cells 11 to 16 is structured such that, when external light is applied by passing through the dial plate 4, this light is applied to the power generation layer 18 through the transparent upper electrode 19, and the power generation layer 18 generates electromotive force by the applied light, as depicted in FIG. 1 and FIG. 4.

These solar cells 11 to 16 are structured by the circle corresponding to the solar panel 3 being divided so as to have the same shape and area, as depicted in FIG. 3.

In this case, the plurality of solar cells 11 to 16 are divisionally formed into a substantially spiral shape so that the minute hand 7b moving there above is always positioned across two adjacent solar cells of the plurality of solar cells 11 to 16.

Also, the plurality of solar cells 11 to 16 are formed into the substantially spiral shape such that areas where the minute hand 7b is positioned across two adjacent solar cells of the plurality of solar cells 11 to 16 are substantially equal to each other, as depicted in FIG. 3.

Moreover, the plurality of solar cells 11 to 16 are each formed into a shape where the length in the circumferential direction gradually elongates toward the radial direction centering on the through hole 3a.

In this case, the plurality of solar cells 11 to 16 are each structured to have an outer circumferential area E1 on the outer circumferential side of the solar panel 3 and an inner circumferential area E2 on the through hole 3a side of the solar panel 3, which are located at positions shifted from each other in the circumferential direction and coupled by a coupling section E3, as depicted in FIG. 3.

That is, the outer circumferential area E1 and the inner circumferential area E2 are each formed into a substantially fan shape having a different size, and the outer circumferential area E1 is provided at a position shifted from the inner circumferential area E2 in the clockwise direction.

As a result, the plurality of solar cells 11 to 16 are each formed into a shape where the inner circumferential area E2 encroaches on the inner circumferential side (that is, on the center through hole 3a side) of a portion of the outer circumferential area E1 positioned in the counterclockwise direction.

In the case of these plurality of solar cells 11 to 16, for example, two solar cells 11 and 12 are formed such that a side portion positioned in the clockwise direction (right side portion in FIG. 3) in the outer circumferential area E1 of one solar cell 11 and a side portion positioned in the counterclockwise direction (left side portion in FIG. 3) in the inner circumferential area E2 of the other solar cell 12 are at positions slightly shifted from each other in the circumferential direction by the connection width of the coupling section E3, on the same straight line in the radial direction centering on the through hole 3a, as depicted in FIG. 3.

Also, the outer circumferential area E1 and the inner circumferential area E2 are formed to have a different radial direction length in accordance with the shape of the minute hand 7b so that, when the minute hand 7b is positioned across two adjacent solar cells 11 and 12, an area of the outer circumferential area E1 of one solar cell 11 over which the minute hand 7b has been positioned and an area of the inner circumferential area E2 of the other solar cell 12 over which the minute hand 7b has been positioned are substantially equal to each other, as depicted in FIG. 3.

For example, the outer circumferential area E1 and the inner circumferential area E2 are formed such that the radial direction length of the outer circumferential area E1 is longer than the radial direction length of the inner circumferential area E2, as depicted in FIG. 3.

As a result, the outer circumferential area E1 and the inner circumferential area E2 are structured such that two areas in the outer circumferential area E1 and the inner circumferential area E2 where the minute hand 7b is positioned across two adjacent solar cells 11 and 12 are substantially equal to each other.

As such, among the plurality of solar cells 11 to 16, not only two solar cells 11 and 12 over which the minute hand 7b is positioned as depicted in FIG. 3, but also other solar cells 13 to 16 are formed to have the above-described shape.

The coupling section E3 coupling the outer circumferential area E1 and the inner circumferential area E2 together is preferably formed to have a sufficient connection width (for example, a width equal to or longer than 1 mm) in order to decrease an electrical resistance value.

The plurality of solar cells 11 to 16 are sequentially connected in series by a plurality of connecting sections 21 at the edge of the through hole 3a provided on the center portion of the solar panel 3, as depicted in FIG. 3 and FIG. 4.

That is, these connecting sections 21, which are formed of conductive paste, are each structured to electrically connect the lower electrode 17 of one of adjacent solar cells 11, 13, and 15 and the upper electrode 19 of the other one of the adjacent solar cells 12, 14, and 16 together.

In this case, two solar cells 11 and 16 positioned at the last end among the plurality of solar cells 11 to 16 are not connected together by the connecting section 21.

Accordingly, the upper electrode 19 of one solar cell 11 and the lower electrode 17 of the other solar cell 16 are connected to a pair of output electrodes (not depicted in the drawing).

As a result, the solar panel 3 is structured to supply generated electric power to a chargeable battery (not depicted in drawing) of the timepiece module 1.

Next, the operation of this pointer-type wristwatch is described.

Normally, with electric power supplied to the timepiece movement 5, the timepiece movement 5 operates to rotate the pointer shaft 6, and the pointers 7 including the hour hand 7a, the minute hand 7b, and the second hand 7c move above the dial plate 4 with the rotation of the pointer shaft 6 so as to indicate the time.

Here, external light such as sunlight is applied to the dial plate 4, and the applied external light passes through the dial plate 4 to be applied to the plurality of solar cells 11 to 16 of the solar panel 3.

Then, the applied external light passes through the transparent protective film 20 and the transparent upper electrode 19 of each of the solar cells 11 to 16 to be applied to each power generation layer 18. With this applied light, each power generation layer 18 generates electric power.

That is, when external light is applied, the power generation layer 18 of each of the plurality of solar cells 11 to 16 generates electromotive force in accordance with the application amount.

By the solar cells 11 to 16 being connected in series by the connecting sections 21, the generated electromotive force is sent from the output electrode (not depicted in the drawing) of each of the solar cells 11 and 16 at the last end to the chargeable battery (not depicted in the drawing) of the timepiece module 1 for recharge.

As such, when the solar panel 3 generates electric power, the pointers 7 moving above the dial plate 4 block part of the external light applied to the solar panel 3, as depicted in FIG. 3. Therefore, among the plurality of solar cells 11 to 16, the light-receiving amounts of two of the solar cells 11 to 16 over which the minute hand 7b of the pointers 7 has been positioned are decreased.

In this case, for example, when the minute hand 7b is positioned across two adjacent solar cells 11 and 12 among the plurality of solar cells 11 to 16 as depicted in FIG. 3, an area of the outer circumferential area E1 of one solar cell 11 over which the minute hand 7b has been positioned and an area of the inner circumferential area E2 of the other solar cell 12 over which the minute hand 7b has been positioned are substantially equal to each other.

Therefore, even when the minute hand 7b is positioned across two solar cells 11 and 12, both light-receiving areas are substantially equal to each other, and an area shaded by the minute hand 7b is substantially equally distributed between two solar cells 11 and 12.

As a result, a current value that is outputted by the entire solar panel 3 is increased as compared with a structure where the minute hand 7b is positioned over only one of the plurality of solar cells 11 to 16.

For example, when an average area of a half of the minute hand 7b in the longitudinal direction is approximately 5.85 mm$^2$ and the solar cells 11 to 16 each have an area of approximately 111.95 mm$^2$, the light-receiving area of each of the solar cells 11 and 12 when the minute hand 7b is positioned across two solar cells 11 and 12 is approximately 106.11 mm$^2$.

Thus, the light-receiving area of each of two solar cells 11 and 12 over which the minute hand 7b has been positioned is increased by approximately 5.1% as compared with a case where the light-receiving area of one of the solar cells 11 to 16 is approximately 95.26 mm$^2$ by the minute hand 7b being positioned over only one of the solar cells 11 to 16.

As a result, the output current of the entire plurality of solar cells 11 to 16 is increased by approximately 5.1%.

As such, in this pointer-type wristwatch, the solar panel 3 above which the pointers 7 mounted on the pointer shaft 6 inserted in the through hole 3a in the center portion move has the plurality of solar cells 11 to 16 arranged in a substantially circular shape. These solar cells 11 to 16 have been divisionally formed to have a substantially spiral shape so that the minute hand 7b of the pointers 7 is always positioned across two of the plurality of solar cells 11 to 16. Therefore, a decrease of light-receiving area due to the minute hand 7b is distributed between two of the plurality of solar cells 11 to 16, and whereby the output current of the entire plurality of solar cells 11 to 16 can be improved.

That is, in the solar panel 3, the minute hand 7b of the pointers 7 moving there above can always be positioned across two of the plurality of solar cells 11 to 16, and therefore a decrease of light-receiving area due to the minute hand 7b can be distributed between two of the plurality of solar cells 11 to 16. As a result, a decrease in the output current of two of the plurality of solar cells 11 to 16 over which the minute hand 7b is positioned can be suppressed, and whereby the output current of the entire plurality of solar cells 11 to 16 can be improved.

In this case, the plurality of solar cells 11 to 16 are formed to have the same shape and area size by equal division, and whereby the light-receiving area of each of two of the plurality of solar cells 11 to 16 over which the minute hand 7b of the pointers 7 is positioned can always be kept constant. As a result, fluctuations in the output current of the entire plurality of solar cells 11 to 16 by the movement of the minute hand 7b can be suppressed. Therefore, the output current of the entire plurality of solar cells 11 to 16 can be kept substantially constant.

Also, the plurality of solar cells 11 to 16 are formed into a shape in which areas where the minute hand 7b of the pointers 7 is positioned across two of the plurality of solar cells 11 to 16 are substantially equal to each other. Therefore, the light-receiving areas of two of the solar cells 11 to 16 over which the minute hand 7b is positioned can be equally distributed to have the same area. As a result, a decrease in the output current of two of the plurality of solar cells 11 to 16 over which the minute hand 7*b* is positioned can be efficiently and equally suppressed. Therefore, the output current of the entire plurality of solar cells 11 to 16 can be reliably improved.

Moreover, the plurality of solar cells 11 to 16 each having the outer circumferential area E1 and the inner circumferential area E2 are formed into a substantially spiral shape such that the inner circumferential area E2 encroaches on the inner circumferential side of the outer circumferential area E1 adjacent to the inner circumferential area E2. Therefore, the minute hand 7*b* of the pointers 7 moving above the plurality of solar cells 11 to 16 can always be reliably and favorably positioned across two adjacent ones of the plurality of solar cells 11 to 16.

In this case, the plurality of solar cells 11 to 16 are each formed into a shape where the length in the circumferential direction gradually elongates toward the radial direction centering on the through hole 3*a* of the solar panel 3. Therefore, the area of the outer circumferential area E1 can be made sufficiently larger than the area of the inner circumferential area E2. As a result, areas of the plurality of solar cells 11 to 16 that are shaded by the minute hand 7*b* being positioned there over can be minimized. This can also improve the output current of the entire plurality of solar cells 11 to 16.

Furthermore, the plurality of solar cells 11 to 16 are connected in series by the connecting sections 21 on the peripheral portion of the through hole 3*a* provide in the center portion of the solar panel 3. This makes resistance to the influence of the pointers 7, and a wide light-receiving area can be ensured for each of the plurality of solar cells 11 to 16.

That is, at the peripheral portion of the through hole 3*a* of the solar panel 3, a light blocking period by the pointers 7 is long and power generation efficiency is low. Thus, by the connecting sections 21 being provided to the peripheral portion of the through hole 3*a*, a loss of power generation due to a change in the light-receiving area by the movement of the pointers 7 can be reduced, whereby the power generation efficiency can be enhanced.

Figure 5:
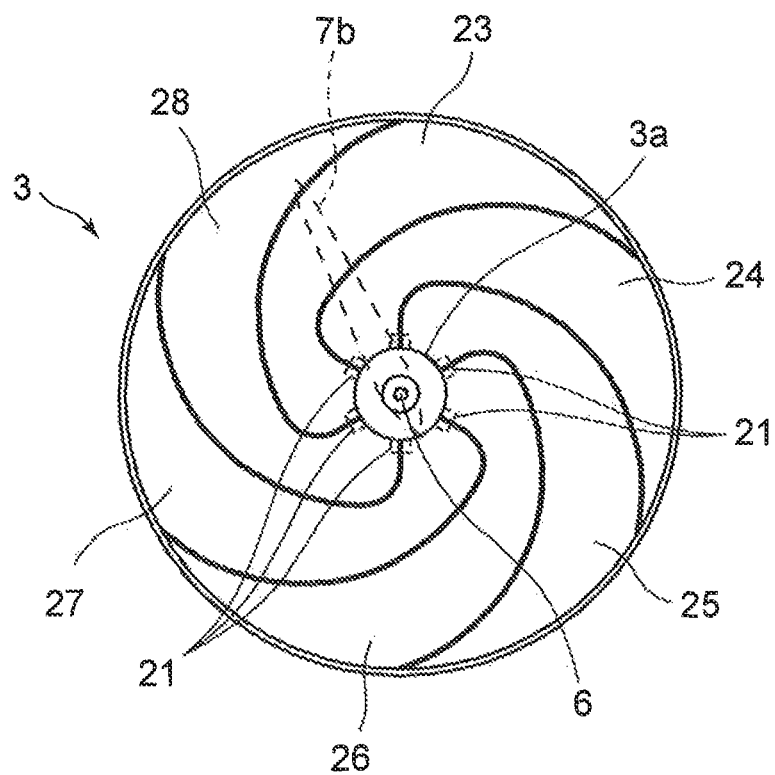
FIG. 5 is an enlarged front view of a modification example of the solar panel of the first embodiment depicted in FIG. 3.

In the above-described first embodiment, the outer circumferential area E1 and the inner circumferential area E2 of each of the plurality of solar cells 11 to 16 are formed into a substantially spiral shape by being coupled to each other and constricted by the coupling section E3. However, the present invention is not limited thereto. For example, as shown in a modification example in FIG. 5, a structure may be adopted in which a plurality of solar cells 23 to 28 are formed into a smoothly-curved spiral shape.

That is, it is only required that the plurality of solar cells 23 to 28 are formed into a spiral shape where the radius of curvature is gradually increased from the through hole 3*a* side of the solar panel 3 toward the outer circumferential side of the solar panel 3.

In this case as well, it is only required that the plurality of solar cells 23 to 28 are formed into a spiral shape such that areas where the minute hand 7*b* of the pointers 7 is positioned across two adjacent ones of the solar cells 23 to 28 are substantially equal to each other.

Also, each of the plurality of solar cells 23 to 28 is only required to be formed into a shape where the length in the circumferential direction gradually elongates toward the radial direction centering on the through hole 3*a*.

With this solar panel 3 as well, operations and effects similar to those of the first embodiment can be achieved.

Second Embodiment

Figure 6:
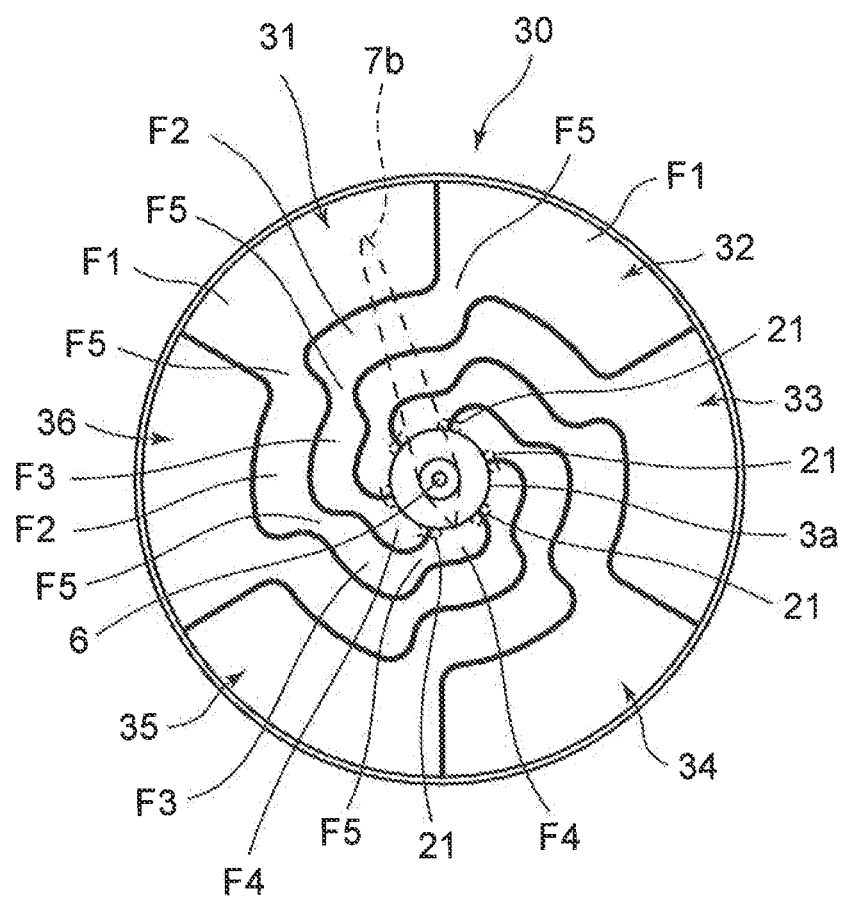
FIG. 6 is an enlarged front view of a solar panel in a second embodiment in which the present invention has been applied to a pointer-type wristwatch.

Next, with reference to FIG. 6, a second embodiment in which the present invention has been applied to a pointer-type wristwatch is described.

Note that sections identical to those in the first embodiment depicted in FIG. 1 to FIG. 4 are provided with the same reference numerals for description.

This pointer-type wristwatch has a structure identical to that of the first embodiment except that a plurality of solar cells 31 to 36 of a solar panel 30 has a structure different from that of the first embodiment, as depicted in FIG. 6.

These solar cells 31 to 36 are structured by a circle corresponding to the solar panel 30 being divided into six portions such that they have the same shape and area, as depicted in FIG. 6.

In this case, the plurality of solar cells 31 to 36 are divisionally formed into a spiral shape so that the minute hand 7*b* of the pointers 7 is always positioned across four sequentially adjacent ones of the plurality of solar cells 31 to 36.

Also, the plurality of solar cells 31 to 36 are formed into the spiral shape such that four areas where the minute hand 7*b* is positioned across four sequentially adjacent ones of the plurality of solar cells 31 to 36 are substantially equal to one another, as depicted in FIG. 6.

Moreover, the plurality of solar cells 31 to 36 are each formed into a shape where the length in the circumferential direction gradually elongates toward the radial direction centering on the through hole 3*a* of the solar panel 30.

In this case, the plurality of solar cells 31 to 36 are each structured to have a first area F1 located on the outer circumferential side of the solar panel 30, a second area F2 located on the inner circumferential side of the first area F1, a third area F3 located on the inner circumferential side of the second area F2, and a fourth area F4 located on the inner circumferential side of the third area F3, with these areas F1 to F4 being sequentially coupled by coupling sections F5 and sequentially arranged at positions shifted from each other along the circumferential direction, as depicted in FIG. 6.

These first to fourth areas F1 to F4 are formed to have different sizes in accordance with the shape of the minute hand 7*b* and to be sequentially arranged at positions shifted from each other in the clockwise direction, as depicted in FIG. 6.

As a result, the first to fourth areas F1 to F4 are structured such that the entire shape obtained by combining these areas forms a fan shape having an opening angle of 60 degrees.

That is, the plurality of solar cells 31 to 36 are formed into a shape in which, with the first area F1 positioned at the outermost perimeter as a reference point, the second area F2 encroaches on the inner circumferential side of the first area F1 positioned in the counterclockwise direction, the third area F3 following the second area F2 encroaches on the inner circumferential side of the second area F2 positioned in the counterclockwise direction, and the fourth area F4 following the third area F3 encroaches on the inner circumferential side of the third area F3 positioned in the counterclockwise direction, as depicted in FIG. 6.

In the case of these solar cells 31 to 36, for example, two solar cells 31 and 32 are formed such that the coupling section F5 coupling the first area F1 and the second area F2 together is provided between a side portion positioned in the counterclockwise direction (left side portion in FIG. 6) in the first area F1 of one solar cell 31 and a side portion positioned in the counterclockwise direction (left side portion in FIG. 6) in the second area F2 of the other solar cell 32, as depicted in FIG. 6.

Also, for example, the two solar cells 31 and 32 of the plurality of solar cells 31 to 36 are formed such that the coupling section F5 coupling the second area F2 and the third area F3 together is provided between a side portion positioned in the counterclockwise direction (left side portion in FIG. 6)

in the second area F2 of one solar cell 31 and a side portion positioned in the counterclockwise direction (left side portion in FIG. 6) in the third area F3 of the other solar cell 32, as depicted in FIG. 6.

Similarly, for example, the two solar cells 31 and 32 of the plurality of solar cells 31 to 36 are formed such that the coupling section F5 coupling the third area F3 and the fourth area F4 together is provided between aside portion positioned in the counterclockwise direction (left side portion in FIG. 6) in the third area F3 of one solar cell 31 and a side portion positioned in the counterclockwise direction (left side portion in FIG. 6) in the fourth area F4 of the other solar cell 32, as depicted in FIG. 6.

In the case of these solar cells 31 to 36, the first to forth areas F1 to F4 and the coupling sections F5 of the other solar cells 33 to 36 are formed similarly to the first to forth areas F1 to F4 and the coupling sections F5 of the solar cells 31 and 32, as depicted in FIG. 6.

Also, the first to fourth areas F1 to F4 are each formed to have a different length in the radial direction so that, when the minute hand 7b is positioned across four sequentially adjacent solar cells 31 to 34, the first to fourth areas F1 to F4 of each of the solar cells 31 to 34 over which the minute hand 7b has been positioned are substantially equal to one another, as depicted in FIG. 6.

That is, the first to fourth areas F1 to F4 are each formed such that the length in the radial direction is gradually shortened from the outer circumferential side of the solar panel 30 toward the through hole 3a in the center portion, as depicted in FIG. 6.

As a result, the first to fourth areas F1 to F4 are structured such that areas where the minute hand 7b is positioned across four sequentially adjacent solar cells 31 to 34 are substantially equal to one another among the first to fourth areas F1 to F4.

In the case of these solar cells 31 to 36, not only the four solar cells 31 to 34 across which the minute hand 7b has been positioned but also the other solar cells 35 and 36 are formed into a shape similar to that described above, as depicted in FIG. 6.

Also, as with the first embodiment, the coupling sections F5 coupling the first to fourth areas F1 to F4 are each preferably formed to have a sufficient connection width (for example, a width equal to or longer than 1 mm) in order to decrease the electrical resistance value.

As a result, in the plurality of solar cells 31 to 36, in a case where an average area for each quarter of the minute hand 7b in the longitudinal direction is approximately 2.80 mm$^2$ and each area of the plurality of solar cells 31 to 36 is approximately 110.17 mm$^2$, the light-receiving area of each of the solar cells 31 to 34 when the minute hand 7b is positioned across four solar cells 31 to 34 is 107.37 mm$^2$, as depicted in FIG. 6.

Thus, the light-receiving area of each of four solar cells 31 to 34 over which the minute hand 7b has been positioned is increased by approximately 6.3% as compared with a case where the light-receiving area of one of the solar cells 31 to 36 is approximately 96.17 mm$^2$ by the minute hand 7b being positioned over only one of the solar cells 31 to 36.

As a result, the output current of the plurality of solar cells 31 to 36 as a whole is increased by approximately 6.3%.

As described above, with this wristwatch solar panel 30, the minute hand 7b of the pointers 7 moving there above can be always positioned across four of the plurality of solar cells 31 to 36. Therefore, a decrease of light-receiving area due to the minute hand 7b can be distributed among four of the plurality of solar cells 31 to 36. As a result, a decrease in the output current of four of the solar cells 31 to 36 over which the minute hand 7b has been positioned can be suppressed more than the case of the first embodiment, whereby the output current of the entire plurality of solar cells 31 to 36 can be significantly improved more than the case of the first embodiment.

In this case as well, the plurality of solar cells 31 to 36 are formed to have the same shape and area size by equal division, and whereby the light-receiving area of each of four of the plurality of solar cells 31 to 36 over which the minute hand 7b is positioned can be kept substantially constant. As a result, fluctuations in the output current of the entire plurality of solar cells 31 to 36 by the movement of the minute hand 7b can be suppressed. Therefore, the output current of the entire plurality of solar cells 31 to 36 can be kept substantially constant.

Also, the plurality of solar cells 31 to 36 are formed into a shape in which areas where the minute hand 7b of the pointers 7 is positioned across four of the plurality of solar cells 31 to 36 are substantially equal to each other. Therefore, the light-receiving areas of four of the solar cells 31 to 36 over which the minute hand 7b is positioned can be substantially equal to one another. As a result, a decrease in the output current of four of the plurality of solar cells 31 to 36 over which the minute hand 7b is positioned can be efficiently and equally suppressed. Therefore, the output current of the entire plurality of solar cells 31 to 36 can be improved more than the case of the first embodiment.

Moreover, the plurality of solar cells 31 to 36 each having the first to fourth areas F1 to F4 from the outer circumferential side toward the through hole 3a in the center portion are formed into a spiral shape such that the second area F2 encroaches on the inner circumferential side of the first area F1 that is an area on the outer circumferential side adjacent to the second area F2, the third area F3 encroaches on the inner circumferential side of the second area F2 that is an area adjacent to the second area F3, and the fourth area F4 encroaches on the inner circumferential side of the third area F3 that is an area adjacent to the fourth area F4. Therefore, the minute hand 7b of the pointers 7 moving above the solar panel 30 can always be reliably and favorably positioned across four of the plurality of solar cells 31 to 36.

In this case as well, the plurality of solar cells 31 to 36 are each into a shape where the length in the circumferential direction gradually elongates toward the radial direction centering on the through hole 3a of the solar panel 30. Therefore, the areas of the first and third areas F1 to F3 positioned on the outer circumferential side can be formed to be larger than the areas of the second to fourth areas F2 and F4 positioned on the inner circumferential side, respectively. As a result, areas of the plurality of solar cells 31 to 36 that are shaded by the minute hand 7b being positioned thereover can be minimized. This can also improve the output current of the entire plurality of solar cells 31 to 36.

In the above-described second embodiment, the first to fourth areas F1 to F4 in each of the plurality of solar cells 31 to 36 are formed into a spiral shape by being coupled to one another and constricted by the coupling section F5. However, the present invention is not limited thereto. For example, as in a modification example in FIG. 7, a structure may be adopted in which the first to fourth areas F1 to F4 are formed into a smoothly-bent spiral shape.

That is, it is only required that the plurality of solar cells 31 to 36 are formed into a spiral shape where the bending angle is gradually decreased from the through hole 3a of the solar panel 30 toward the outer circumferential side of the solar panel 30.

Figure 7:
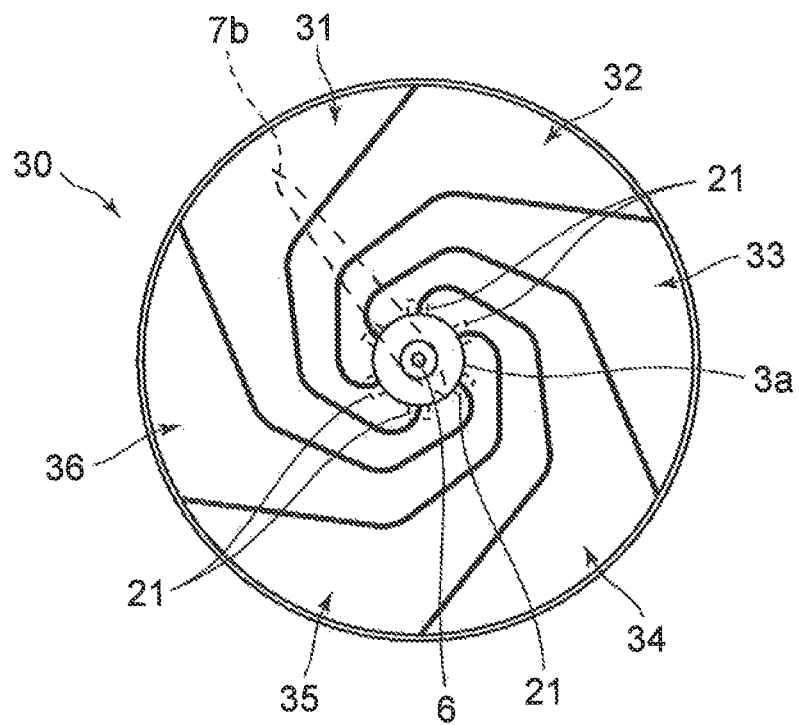
FIG. 7 is an enlarged front view of a modification example of the solar panel of the second embodiment depicted in FIG. 6.

In this case as well, it is only required that the plurality of solar cells 31 to 36 are formed into a spiral shape such that areas where the minute hand 7b of the pointers 7 is positioned across four sequentially adjacent ones of the solar cells 31 to 36 are substantially equal to one another, as depicted in FIG. 7.

Also, each of the plurality of solar cells 31 to 36 is only required to be formed into a shape where the length in the circumferential direction gradually elongates toward the radial direction centering on the through hole 3a.

With this solar panel 30 as well, operations and effects similar to those of the second embodiment can be achieved.

Third Embodiment

Figure 8:
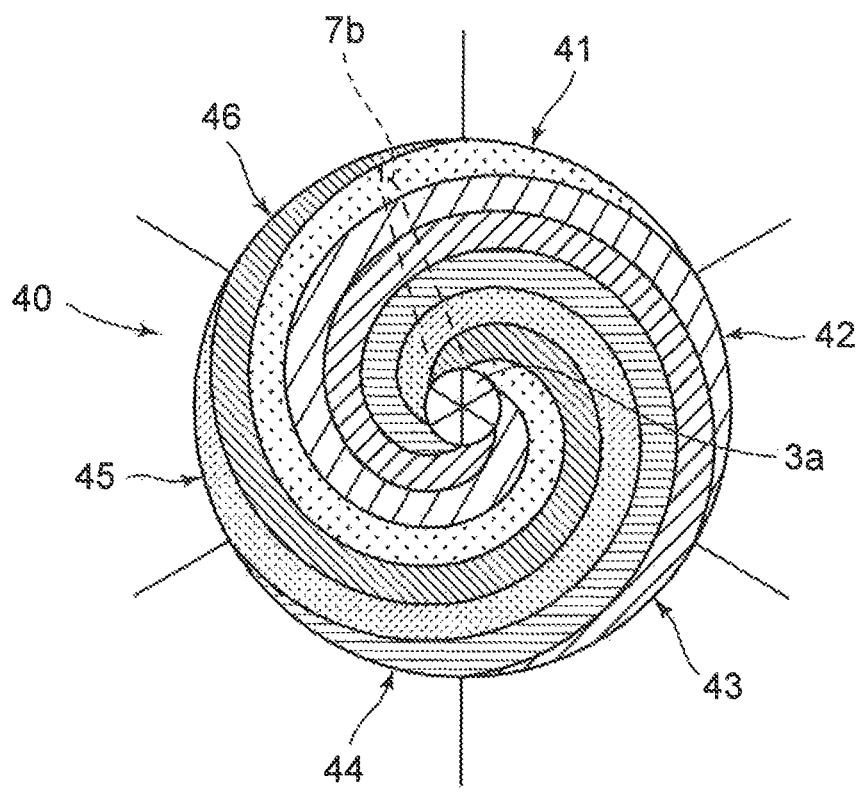
FIG. 8 is an enlarged front view of a solar panel in a third embodiment in which the present invention has been applied to a pointer-type wristwatch.

Next, with reference to FIG. 8, a third embodiment in which the present invention has been applied to a pointer-type wristwatch is described. In this case as well, sections identical to those in the first embodiment depicted in FIG. 1 to FIG. 4 are provided with the same reference numerals for description.

This pointer-type wristwatch has a structure identical to that of the first embodiment except that a plurality of solar cells 41 to 46 of a solar panel 40 has a structure different from that of the first embodiment, as depicted in FIG. 8.

These solar cells 41 to 46 are structured by a circle corresponding to the solar panel 40 being divided into six portions such that they have the same shape and area, as depicted in FIG. 8.

In this case, the plurality of solar cells 41 to 46 are divisionally formed into a spiral shape so that the minute hand 7b of the pointers 7 is always positioned across all of the plurality of solar cells 41 to 46.

Also, the plurality of solar cells 41 to 46 are formed into the spiral shape such that areas where the minute hand 7b is positioned across all of the plurality of solar cells 41 to 46 are substantially equal to one another.

Moreover, the plurality of solar cells 41 to 46 are each formed to have a substantially equal length (width) in the radial direction, and are formed into the spiral shape such that the radius of curvature is gradually increased from the through hole 3a side of the solar panel 40 toward the outer circumferential side, as depicted in FIG. 8.

Furthermore, the plurality of solar cells 41 to 46 are formed into the spiral shape so as to be spirally curved from the perimeter of the through hole 3a of the solar panel 40 to the outer perimeter of the solar panel 40.

With this wristwatch solar panel 40, the minute hand 7b of the pointers 7 moving there above can be always positioned across all of the plurality of solar cells 41 to 46, and therefore a decrease of light-receiving area due to the minute hand 7b can be distributed among all of the plurality of solar cells 41 to 46, which is more than the first embodiment.

Accordingly, with this solar panel 40, the light-receiving areas of all of the solar cells 41 to 46 over which the minute hand 7b is positioned can be increased more than those of the first embodiment, whereby a decrease in the output current of all of the solar cells 41 to 46 over which the minute hand 7b is positioned can be reliably and favorably suppressed. Therefore, the output current of the entire plurality of solar cells 41 to 46 can be significantly improved more than the case of the first embodiment.

In this case as well, the plurality of solar cells 41 to 46 are formed to have the same shape and area size by equal division, whereby the light-receiving areas of all of the plurality of solar cells 41 to 46 over which the minute hand 7b is positioned can be kept substantially constant. As a result, fluctuations in the output current of the entire plurality of solar cells 41 to 46 due to the movement of the minute hand 7b can be suppressed. Therefore, the output current of the entire plurality of solar cells 41 to 46 can be kept substantially constant.

Also, the plurality of solar cells 41 to 46 are formed into a spiral shape so that areas where the minute hand 7b of the pointers 7 is positioned over all of the plurality of solar cells 41 to 46 are substantially equal to each other. Therefore, the light-receiving areas of all of solar cells 41 to 46 over which the minute hand 7b is positioned can be made substantially equal to one another. As a result, the output current values of all of the solar cells 41 to 46 over which the minute hand 7b is positioned can be made substantially equal to one another. Therefore, the output current of the entire plurality of solar cells 41 to 46 can be significantly improved more than the case of the first embodiment.

Moreover, the plurality of solar cells 41 to 46 are each formed to have a substantially equal length (width) in the radial direction, and are formed into a spiral shape such that the radius of curvature is gradually increased from the through hole 3a of the solar panel 40 toward the outer circumferential side of the solar panel 40 and the solar cells are spirally curved from the perimeter of the through hole 3a to the outer perimeter of the solar panel 40. Therefore, the minute hand 7b of the pointers 7 moving above the solar panel 40 can always be reliably and favorably positioned across all of the plurality of solar cells 41 to 46.

In the above-described third embodiment, the plurality of solar cells 41 to 46 are formed such that all of the lengths (widths) in the radial direction are equal to one another. However, the present invention is not limited thereto. For example, the plurality of solar cells 41 to 46 of the solar panel 40 may be each formed such that the length (width) in the radial direction is gradually increased from the through hole 3a of the solar panel 40 toward the outer perimeter of the solar panel 40.

In this case as well, it is only required that the plurality of solar cells 41 to 46 are divisionally formed into a spiral shape such that the minute hand 7b of the pointers 7 is always positioned across all of the plurality of solar cells 41 to 46.

Also, the plurality of solar cells 41 to 46 are only required to be formed into a spiral shape such that areas where the minute hand 7b is positioned across all of the plurality of solar cells 41 to 46 are substantially equal to one another.

In this solar panel 40 as well, operations and effects substantially similar to those of the third embodiment can be achieved.

Fourth Embodiment

Figure 9:
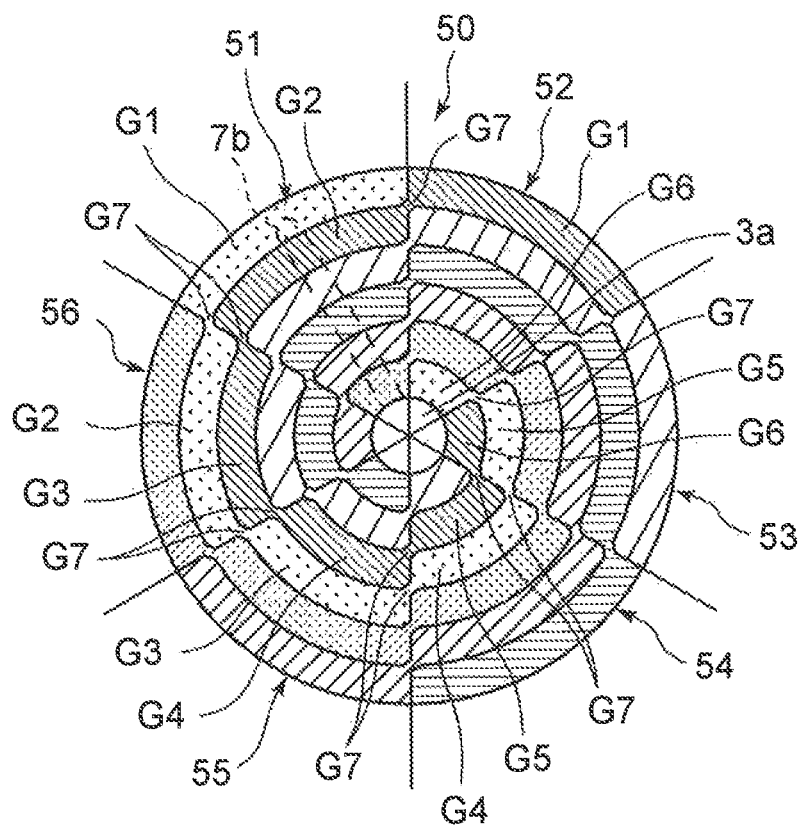
FIG. 9 is an enlarged front view of a solar panel in a fourth embodiment in which the present invention has been applied to a pointer-type wristwatch.

Next, with reference to FIG. 9, a fourth embodiment in which the present invention has been applied to a pointer-type wristwatch is described.

In this case as well, sections identical to those in the first embodiment depicted in FIG. 1 to FIG. 4 are provided with the same reference numerals for description.

This pointer-type wristwatch has a structure identical to that of the first embodiment except that a plurality of solar cells 51 to 56 of a solar panel 50 has a structure different from that of the first embodiment, as depicted in FIG. 9.

These solar cells 51 to 56 are structured by a circle corresponding to the solar panel 50 being divided into six portions such that they have the same shape and area, as depicted in FIG. 9.

In this case, the plurality of solar cells 51 to 56 are divisionally formed into a step-like spiral shape so that the minute hand 7b of the pointers 7 is always positioned across all of the plurality of solar cells 51 to 56.

Also, the plurality of solar cells 51 to 56 are formed into the substantially step-like spiral shape such that areas where the minute hand 7b is positioned across all of the plurality of solar cells 51 to 56 are substantially equal to one another, as depicted in FIG. 9.

In this case, the plurality of solar cells 51 to 56 are each formed into a shape where the length in the circumferential direction gradually elongates toward the radial direction centering on the through hole 3a of the solar panel 50.

Moreover, the plurality of solar cells 51 to 56 are each formed to have a substantially equal length (width) in the radial direction.

Furthermore, the plurality of solar cells 51 to 56 each have a first area G1 located on the outer circumferential side of the solar panel 50, a second area G2 located on the inner circumferential side of the first area G1, a third area G3 located on the inner circumferential side of the second area G2, a fourth area G4 located on the inner circumferential side of the third area G3, a fifth area G5 located on the inner circumferential side of the fourth area G4, and a sixth area G6 located on the inner circumferential side of the fifth area G5, as depicted in FIG. 9.

In this case, the plurality of solar cells 51 to 56 are each structured to have the first to sixth areas G1 to G6 sequentially formed in a staircase pattern at positions shifted from one another along the circumferential direction and sequentially coupled by coupling sections G7, as depicted in FIG. 9.

These first to sixth areas G1 to G6 are each formed to have a different size, and are sequentially formed at positions shifted from one another by 60 degrees in the counterclockwise direction.

As a result, the first to sixth areas G1 to G6 are structured such that the entire shape obtained by combining theses areas forms a fan shape having an opening angle of 60 degrees.

Still further, the plurality of solar cells 51 to 56 are formed into a shape in which, with the first area G1 positioned at the outermost perimeter as a reference point, the second area G2 encroaches on the inner circumferential side of the first area G1 positioned in the counterclockwise direction thereof, the third area G3 encroaches on the inner circumferential side of the second area G2 positioned in the counterclockwise direction thereof, the fourth area G4 encroaches on the inner circumferential side of the third area G3 positioned in the counterclockwise direction thereof, the fifth area G5 encroaches on the inner circumferential side of the fourth area G4 positioned in the counterclockwise direction thereof, and the sixth area G6 encroaches on the inner circumferential side of the fifth area G5 positioned in the counterclockwise direction thereof, as depicted in FIG. 9.

In this case, the plurality of solar cells 51 to 56 are structured such that the coupling sections G7, which are sequentially coupling the first to sixth areas G1 to G6 so as to form a staircase pattern, are radially positioned at every 60 degrees centering on the through hole 3a of the solar panel 50, as depicted in FIG. 9.

In this case, as with the first embodiment, each coupling section G7 is preferably formed to have a connection width equal to or longer than 1 mm in order to decrease the electrical resistance value.

With this wristwatch solar panel 50, the minute hand 7b of the pointers 7 moving there above can be always positioned across all of the plurality of solar cells 51 to 56. Therefore, as with the third embodiment, a decrease of light-receiving area due to the minute hand 7b can be distributed among all of the plurality of solar cells 51 to 56.

Thus, the light-receiving areas of all of the solar cells 51 to 56 over which the minute hand 7b is positioned can be increased more than the case of the first embodiment. As a result, a decrease in the output current of all of the solar cells 51 to 56 over which the minute hand 7b is positioned can be reliably and favorably suppressed, whereby the output current of the entire plurality of solar cells 51 to 56 can be significantly improved more than the case of the first embodiment.

In this case as well, the plurality of solar cells 51 to 56 are formed to have the same shape and area size by equal division, and whereby the light-receiving areas of all of the plurality of solar cells 51 to 56 over which the minute hand 7b of the pointers 7 is positioned can be kept substantially constant. As a result, fluctuations in the output current of the entire plurality of solar cells 51 to 56 due to the movement of the minute hand 7b can be suppressed. Therefore, the output current of the entire plurality of solar cells 51 to 56 can be kept substantially constant.

Also, the plurality of solar cells 51 to 56 are formed into a substantially step-like spiral shape such that areas where the minute hand 7b of the pointers 7 is positioned on all of the plurality of solar cells 51 to 56 are substantially equal to one another. Therefore, the light-receiving areas of all of the plurality of solar cells 51 to 56 over which the minute pointer 7b is positioned can be made substantially equal to one another. As a result, the output current values of all of the solar cells 51 to 56 over which the minute hand 7b is positioned can be made substantially equal to one another. Thus, as with the third embodiment, the output current of the entire plurality of solar cells 51 to 56 can be significantly improved.

Moreover, the plurality of solar cells 51 to 56 are each formed to have a substantially equal length (width) in the radial direction, and are formed into a substantially spiral shape such that the length in the circumferential direction is increased in steps from the through hole 3a of the solar panel 50 toward the outer circumferential side of the solar panel 50 at every 60 degrees and the first to sixth areas G1 to G6 are spirally curved in steps. Therefore, the pointers 7 moving above the plurality of solar cells 51 to 56 can always be reliably and favorably positioned across all of the plurality of solar cells 51 to 56.

Figure 10:
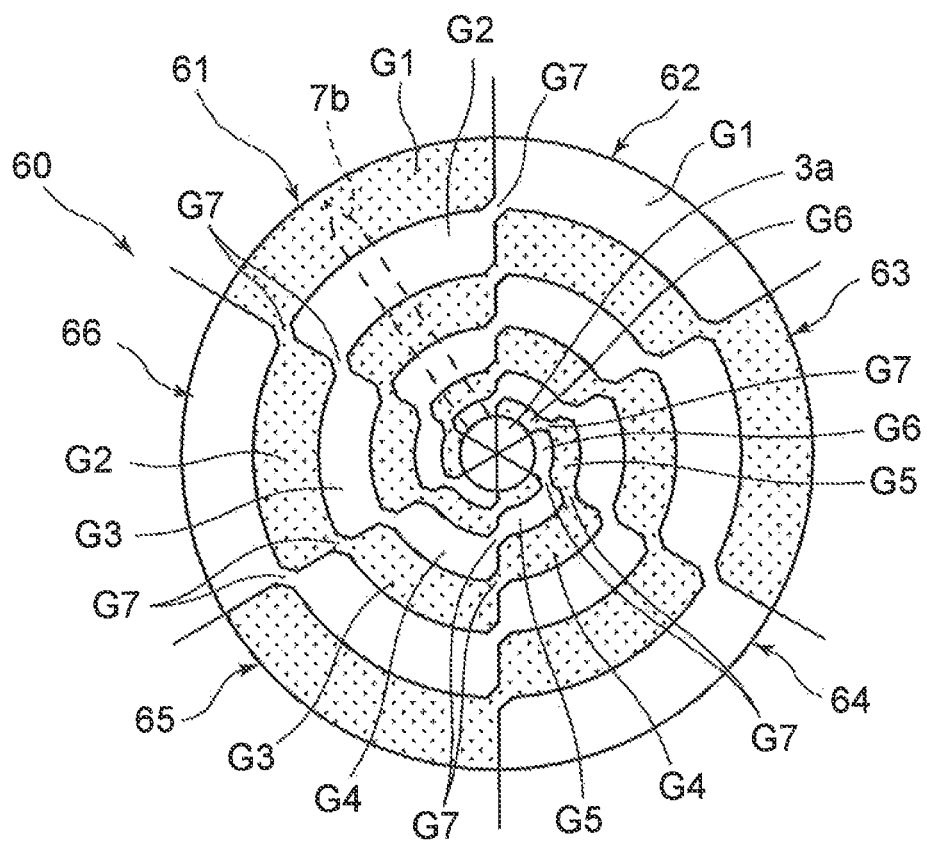
FIG. 10 is an enlarged front view of a modification example of the solar panel of the fourth embodiment depicted in FIG. 9.

In the above-described fourth embodiment, the plurality of solar cells 51 to 56 are formed such that all of the lengths (widths) of the first to sixth areas G1 to G6 in the radial direction are equal to one another. However, the present invention is not limited thereto. For example, as in a modification example depicted in FIG. 10, a structure may be adopted in which a plurality of solar cells 61 to 66 of a solar panel 60 are each formed such that the length (width) of each of the first to sixth areas G1 to G6 in the radial direction is gradually increased from the through hole 3a of the solar panel 60 toward the outer perimeter of the solar panel 60.

In this case as well, it is only required that the plurality of solar cells 61 to 66 are divisionally formed into a substantially step-like spiral shape where the minute hand 7b of the pointers 7 is always positioned across all of the plurality of solar cells 61 to 66.

Also, the plurality of these solar cells 61 to 66 are only required to be formed into a substantially step-like spiral shape such that areas where the minute hand 7b is positioned across all of the plurality of solar cells 61 to 66 are substantially equal to one another.

With this solar panel 60, operations and effects substantially similar to those of the fourth embodiment can be achieved.

In each of the above-described first to fourth embodiments and the modification examples thereof, the connecting sections 21 connecting the plurality of solar cells in series are sequentially provided along the perimeter of the through hole 3a of the solar panel. However, the present invention is not limited thereto. The connecting section 21 may be sequentially provided along the outer perimeter of the plurality of solar cells.

Also, in each of the above-described first to fourth embodiments and the modification examples thereof, the present invention has been applied to a pointer-type wristwatch. However, the present invention is not necessarily applied to a wristwatch. The present invention can be applied to various pointer-type timepieces, such as a travel watch, an alarm clock, a table clock, and a wall clock, and can also be widely applied to measuring instruments such as a pointer-type meter.

While the present invention has been described with reference to the preferred embodiments, it is intended that the invention be not limited by any of the details of the description therein but includes all the embodiments which fall within the scope of the appended claims.

What is claimed is:

1. A solar panel formed into a substantially circular shape and having a through hole which is provided at a center portion thereof and into which a pointer shaft is inserted, and a pointer which is mounted on the pointer shaft and which moves above the solar panel, the solar panel comprising:
   a plurality of solar cells arranged in a substantially circular shape,
   wherein the plurality of solar cells are divisionally formed such that the pointer moving above the plurality of solar cells is always positioned over at least two of the plurality of solar cells, and
   wherein each of the plurality of solar cells is divided into an outer circumferential area and an inner circumferential area that are coupled by a coupling section, and that are respectively positioned on an outer circumferential side of the coupling section and on an inner circumferential side of the coupling section,
   wherein a width of the coupling section is narrower than a width of the outer circumferential area and a width of the inner circumferential area, and
   wherein the plurality of solar cells are formed into a shape in which areas where the pointer is positioned across two or more of the plurality of solar cells are equal to each other.

2. The solar panel according to claim 1, wherein the plurality of solar cells are formed to have a same shape and area size by equal division.

3. The solar panel according to claim 1, wherein the plurality of solar cells are each formed into a shape where a length in a circumferential direction gradually elongates toward a radial direction centering on the through hole.

4. The solar panel according to claim 1, wherein the plurality of solar cells are connected in series by connecting sections at perimeter portions of the through hole.

5. The solar panel according to claim 1, wherein the plurality of solar cells are each formed such that a width in a radial direction thereof is gradually increased from the through hole of the solar panel toward an outer perimeter of the solar panel.

6. A timepiece comprising:
   a timepiece module having a timepiece movement, the solar panel according to claim 1, a dial plate, and a housing; and
   a timepiece case where the timepiece module is placed.

* * * * *